United States Patent
Taniguchi et al.

(12)

(10) Patent No.: US 6,745,302 B1
(45) Date of Patent: Jun. 1, 2004

(54) METHOD AND CIRCUIT FOR ENABLING A CLOCK-SYNCHRONIZED READ-MODIFY-WRITE OPERATION ON A MEMORY ARRAY

(75) Inventors: Kazuo Taniguchi, Kanagawa (JP); Masaharu Yoshimori, Tokyo (JP)

(73) Assignee: Sony Corporation (JP)

( * ) Notice: Subject to any disclaimer, the term of this patent is extended or adjusted under 35 U.S.C. 154(b) by 644 days.

(21) Appl. No.: 09/394,039

(22) Filed: Sep. 13, 1999

Related U.S. Application Data

(62) Division of application No. 08/905,565, filed on Aug. 4, 1997, now Pat. No. 5,996,052.

(30) Foreign Application Priority Data

Aug. 20, 1996 (JP) .......................................... P08-218843

(51) Int. Cl.[7] .............................................. G06F 12/06
(52) U.S. Cl. ...................... 711/155; 711/169; 712/212; 710/20; 710/45
(58) Field of Search ............................ 365/194, 189.01; 711/1, 140, 155, 167, 169, 168; 712/212, 219, 216; 710/20, 36, 45

(56) References Cited

U.S. PATENT DOCUMENTS

| 4,184,051 A | * | 1/1980 | Clingenpeel | ................ 370/435 |
| 4,673,930 A | * | 6/1987 | Bujalski et al. | ................ 345/24 |
| 4,740,923 A | * | 4/1988 | Kaneko et al. | ............. 365/194 |
| 5,602,999 A | * | 2/1997 | Hyatt | ............................ 711/1 |
| 5,828,606 A | * | 10/1998 | Mick | ..................... 365/189.05 |

* cited by examiner

*Primary Examiner*—B. James Peikari
(74) *Attorney, Agent, or Firm*—Rader, Fishman & Grauer PLLC; Ronald P. Kananen

(57) ABSTRACT

A semiconductor memory enabling a read modify write operation of data, comprising: a memory cell array including a plurality of memory cells arranged in a matrix and able to be written with and read out data; a read address decoding means for independently decoding an address of a read memory cell in response to a read address; a write address decoding means for independently decoding an address of a write memory cell in response to a write address; a data reading means for reading data of a memory cell addressed by the read address decoding means; a data writing means for writing data to a memory cell addressed by the write address decoding means; and an address delay means by which a write address decoded by the write address decoding means is delayed by a predetermined time from a read address decoded by the read address decoding means, wherein the predetermined time is set as a predetermined plurality of times of basic synchronization pulse periods so that the data read modify write operation is accomplished in a pipeline manner by the basic synchronized pulse.

23 Claims, 8 Drawing Sheets

METHOD AND CIRCUIT FOR ENABLING A CLOCK-SYNCHRONIZED READ-MODIFY-WRITE OPERATION ON A MEMORY ARRAY

This application is a divisional of application Ser. No. 08/905,565, filed now U.S. Pat. No. 5,996,052.

BACKGROUND OF THE INVENTION

1. Field of the Invention

The present invention relates to a semiconductor memory device capable of performing a high speed read modify write (hereinafter referred to as an "RMW") operation aimed at a z- buffer for performing hidden-surface processing in the field for example of three dimensional computer graphics (hereinafter referred to as "3DCG").

2. Description of the Related Art

In recent years, high speed, large capacity memories, for example, a clock synchronization (synchronous) dynamic random access memories (DRAM) and a run-bus specification type have appeared.

Further, the field of 3DCG is rapidly spreading due to the improvement of the performances of personal computers, family computer game machines, etc. on the one hand and demands for higher speed and larger capacity memory than the past as the image memory for 3DCG.

For one application of an image memory, there are a frame buffer for storing drawing data and a z- buffer for storing a z- coordinate necessary for performing the hidden-surface processing indispensable for 3DCG.

In hidden-surface processing, polygonal drawing information referred to as polygons is generated. The size of the z- coordinate is compared with the periphery to calculate whether the polygon exists before or after other polygons, and processing of a drawing image is carried out by the polygons existing before the other polygon.

Accordingly, in the z- buffer for storing the z- coordinate, it is necessary to read the z- address of each polygon and perform the write modification after comparison with the other z- address. The operation thereof is basically an RMW operation.

FIG. 1 is a block diagram of a related art clock synchronization type memory.

In the figure, reference numeral 20 denotes a memory array, 22 an address decoder, 24 a register for temporarily holding an input signal of the address decoder 22, 26 an input buffer, and 28 an output buffer. Further, ADD represents an address signal, R/W-Data represents input/output data, and OE-cnt. represents an output control signal.

At present, in a generally commercially available general purpose memory, the same terminals are used for input/output of the data to and from the memory array 20 for decreasing the number of pins of the package as shown in FIG. 1, and the input and output of the data is switched by an output control signal OE-cnt. Namely, the input buffer 26 and the output buffer 28 are connected in parallel in inverse directions. The output buffer 28 is not operated when there is no input of the output control signal OE-cnt.

FIG. 2 is a flowchart of the operation when making general purpose memory perform an RMW operation for performing the hidden-surface processing of 3DCG.

In the figure, symbols A0, A1, denote address numbers in the memory array. The address signal ADD in the command is decoded (Ad-Dec) for every clock signal CLK with respect to the memory cell of this address number and output (D-out) after the stored data is read out (mem-R). After this data output, the z- address is subjected to the comparison processing in the next several clock sections, and the write modification to an original address in the memory is carried out. This RMW operation is continuously repeated in units of several addresses while shifting each address by one pulse each by the clock signal CLK.

In actuality, about three clocks are enough for the comparison processing per se, but in this illustrated example, continuous processing is carried out in units of six addresses. Further, as described above, it is necessary to use the same terminals for input/output, shift the output buffer 28 to the non-operating state by the output control signal OE-cot. at the switching thereof, and guarantee a high input impedance, therefore eight clock sections are required until the write modification from the data output is carried out in each address. For this reason, when viewing this from the command, as illustrated, a waiting section (in this case, 4 clocks worth) becomes necessary in the period of from R5 to W0, and the efficiency of RMW is bad.

In order to shorten the waiting section of this command, it can be considered too to make the address unit to be continuously processed small and shorten the clock section until the write modification from the data output of each address is carried out, but the number of times of switching of the output buffer 28 will be increased by this. For this reason, there is a limit in also the shortening of the command waiting section, and the control becomes complex if the input/output terminal is frequently switched.

In order to avoid this command waiting time, as shown in FIG. 3, the commonly used input/output pin can be separated.

When this separated input/output type memory is used for the RMW operation, as shown in the timing chart of FIG. 4, the waiting section of a command can be eliminated.

In a memory having the configuration shown in FIG. 3, it suffers from the disadvantage that the number of pins is increased, thus it was not practical, but a great increase of the bit width has become possible by the memory/logic mixing process in recent years, therefore the efficiency of the RMW can be enhanced to a certain extent by using this type of memory.

However, even if this method is adopted, as shown in FIG. 4, the input of the address signal is made common at the time of reading and writing of the data so as to suppress an increase in the number of pins, therefore the read/write operation of data still takes two clock sections and, thus, in this meaning, it does not lead to a drastic enhancement of efficiency of a RMW.

Namely, when it is desired to further improve the drawing performance of 3DCG, the fact that a plurality of clock sections are required for every read/write operation of the data becomes a major obstacle.

SUMMARY OF THE INVENTION

An object of the present invention is to provide a semiconductor memory device which makes it possible to perform the data write and read operations in the same clock section for a memory operating in clock synchronization and capable of continuously performing a high speed RMW operation.

According to a first aspect of the present invention, there is provided a semiconductor memory enabling a read modify write operation of data, comprising: a memory cell array including a plurality of memory cells arranged in a matrix and able to be written and read; a read address decoding means for independently decoding a read address of a memory cell in response to a first designated address; a write address decoding means for independently decoding a write address of a memory cell in response to a second designated address; a data reading means for reading data of a memory cell addressed by said decoded read address in said read address decoding means; and a data writing means for writing data to a memory cell addressed by the decoded write address in the write address decoding means.

According to a second aspect of the present invention, there is provided a semiconductor memory enabling a read modify write operation of data, comprising: a memory cell array including a plurality of memory cells arranged in a matrix and able to be written with and read; a read address decoding means for independently decoding an address of a read memory cell in response to a first designated address; a write address decoding means for independently decoding a write address of a memory cell in response to a second designated address; a data reading means for reading data of a memory cell addressed by the decoded read address in the read address decoding means; a data writing means for writing data to a memory cell addressed by the decoded write address in the write address decoding means; and an address delay means by which the decoded write address decoded by the write address decoding means is delayed by a predetermined time from a read address decoded by the read address decoding means, the predetermined time being set as a predetermined plurality of times of basic synchronization pulse periods so that the data read modify-write operation is accomplished in a pipeline manner by the basic synchronized pulse.

Preferably, the address delay means includes an auxiliary temporary memory for storing, the same input address signal to said read address decoding means, the auxiliary temporary memory being arranged at an input stage of the write address decoding means. Preferably, the auxiliary temporary memory includes a predetermined plurality of sub-auxiliary temporary memories in series connection, each of the sub auxiliary temporary memories being able to input the input address signal simultaneously.

Preferably, the predetermined plurality of memories in series connection is able to change in response to a point signal by which at least one of an input stage sub auxiliary memory or an output stage sub auxiliary temporary memory is pointed-out.

Preferably, the auxiliary temporary memory includes a predetermined plurality of registers in series connection, the registers being able to input the input address signal simultaneously, wherein the input address signal is output after the predetermined plurality of data shifts via the registers, each data shift being accomplished synchronized with the basic synchronized pulse.

According to a third aspect of the present invention, there is provided a method of a semiconductor memory enabling a read modify write operation of data, the semiconductor memory comprising: a memory cell array including a plurality of memory cells arranged in a matrix and able to be written with and read out data; a read address decoding means for independently decoding an address of a read memory cell in response to a read address: a write address decoding means for independently decoding an address of a write memory cell in response to a write address; and an address delay means by which a write address decoded by said write address decoding means. Using this is delayed by a predetermined time from a read address decoded by said read address decoding means using this method, the predetermined time is set as a predetermined plurality of times of basic synchronization pulse periods so that the data read-modify write operation is accomplished in a pipeline manner by the basic synchronized pulse.

Preferably, the address delay means includes an auxiliary temporary memory for storing the same input address signal to the read address decoding means, and wherein the auxiliary temporary memory is arranged at an input stage of the write address decoding means.

Preferably, the auxiliary temporary memory includes a predetermined plurality of sub-auxiliary temporary memories in series connection, and wherein each of the sub auxiliary temporary memories is able to input the input address signal simultaneously.

Preferably, the predetermined plurality of memories in series connection is able to change according to a point signal by which at least one of an input stage sub auxiliary memory or an output stage sub auxiliary temporary memory is point out.

Preferably, the auxiliary temporary memory includes a predetermined plurality of registers in series wherein the registers are able to input the input address signal simultaneously, and wherein the input address signal is outputted after the predetermined plurality of data shifts via the registers, each data shift being accomplished synchronized with the basic synchronized pulse.

According to a fourth aspect of the present invention, there is provided method of read modify write operation of data, comprising the steps of: independently decoding a read address of a memory cell in response to a first designated address; independently decoding a write address of a memory cell in response to a second designated address; reading data in a memory cell addressed by the decoded read address; and writing data to a memory cell addressed by the decoded write address.

According to a fifth aspect of the present invention, there is provided method of read modify write operation of data, comprising the steps of: independently decoding a read address of a memory cell in response to a first designated address; independently decoding a write address of a memory cell in response to a second designated address; reading data of a memory cell addressed by the decoded read address; writing data to a memory cell addressed by the decoded write address; and delaying the decoded write address by a predetermined time from the time of the decoding of the read address, the predetermined time being defined as a predetermined plurality of times of basic synchronization pulse periods so that the data read modify write operation is accomplished in a pipeline manner by the basic synchronized pulse. By this, address designations at the time of reading and writing of the data or the reading and writing of data in a memory array conventionally requiring three clock cycles can be carried out in the same clock section in a pipeline fashion.

Accordingly, the efficiency of the RMW operation is raised to two times the related art operation, and a semiconductor memory device optimum as for example the buffer for 3DCG can be realized.

BRIEF DESCRIPTION OF THE DRAWINGS

These and other objects and features of the present invention will become more apparent from the following description of the preferred embodiments made with reference to the attached drawings, wherein.

DESCRIPTION OF THE PREFERRED EMBODIMENTS

Figure 1:
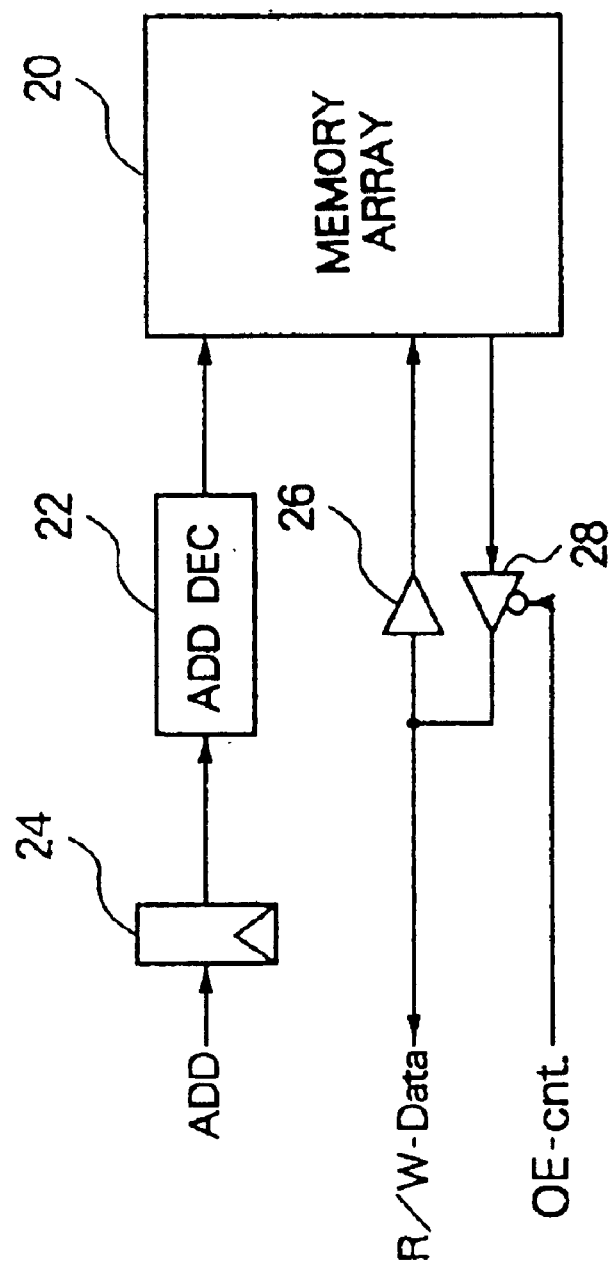
FIG. 1 is a schematic block diagram of the configuration of the related art semiconductor memory device.

Below, semiconductor memory devices according to the present invention will be explained in detail by referring to the drawings.

First Embodiment

Figure 5:
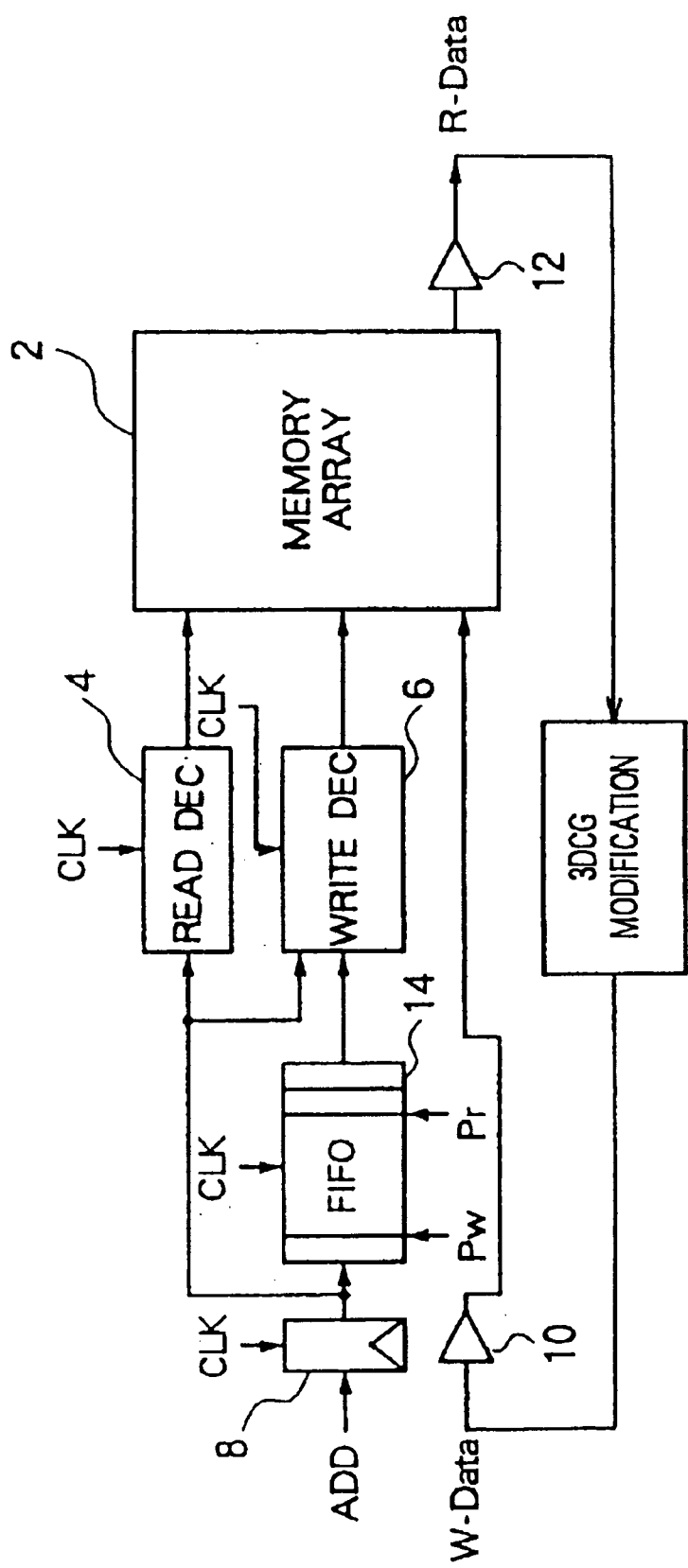
FIG. 5 is a schematic block diagram of the configuration of a semiconductor memory device according to a first embodiment of the present invention.

FIG. 5 is a schematic block diagram of the configuration of a semiconductor memory device as one example of a semiconductor memory device according to the present embodiment.

In FIG. 5, reference numeral 2 denotes a memory array of for example a DRAM configuration, 4 an address decoder used only for a data read operation, 6 an address decoder used only for a data write operation, 8 a register for temporarily holding the input signals of both decoders 4 and 6, 10 a data input buffer, and 12 a data output buffer. Further, ADD designates an address signal, W-Data write data to be written into the memory array 2, and R-Data designates read data to be read from the memory array 2.

The clock signal CLK Is input to both address decoders 4 and 6 and the register 8. Further, control signals of a not illustrated command etc. are Input to the two address decoders 4 and 6. The activation/operation stop is controlled by this.

In the present embodiment, as an example of the delay unit of the present invention for delaying the address designation by the address decoder 6 used only for data writing by a predetermined time, a first-in first-out semiconductor memory 14 (hereinafter, referred to as FIFO memory) is connected to the input side of the address decoder 6 used only for writing. The write decode unit of the present invention is constituted by this FIFO memory 14 and the write only address decoder 6.

The FIFO memory 14 is configured with a predetermined number of unit memory stages of a predetermined number of bits to which at least address signals ADD can be connected together. Usually, this unit memory stage is constituted by a shift register. Further, the number of stages thereof is set to an extent that the expected maximum delay time is obtained in accordance with the operation method of the RMW (Read Modify Write) in which the semiconductor memory device is used.

This FIFO memory 14 is provided with a not illustrated pointer terminal. A starting point (write pointer $P_W$) of the unit memory stage for storing the address signal ADD and an ending point (read pointer Pr) for outputting the address signal ADD to the write only address decoder 6 side can be freely set in accordance with the pointer signal input to this. Note that, it is also possible to set one of either write pointer $P_W$ or the read pointer Pr.

In the FIFO memory 14, the activation/operation stop is switched upon receipt of an instruction by a control signal such as a not illustrated command.

Figure 6:
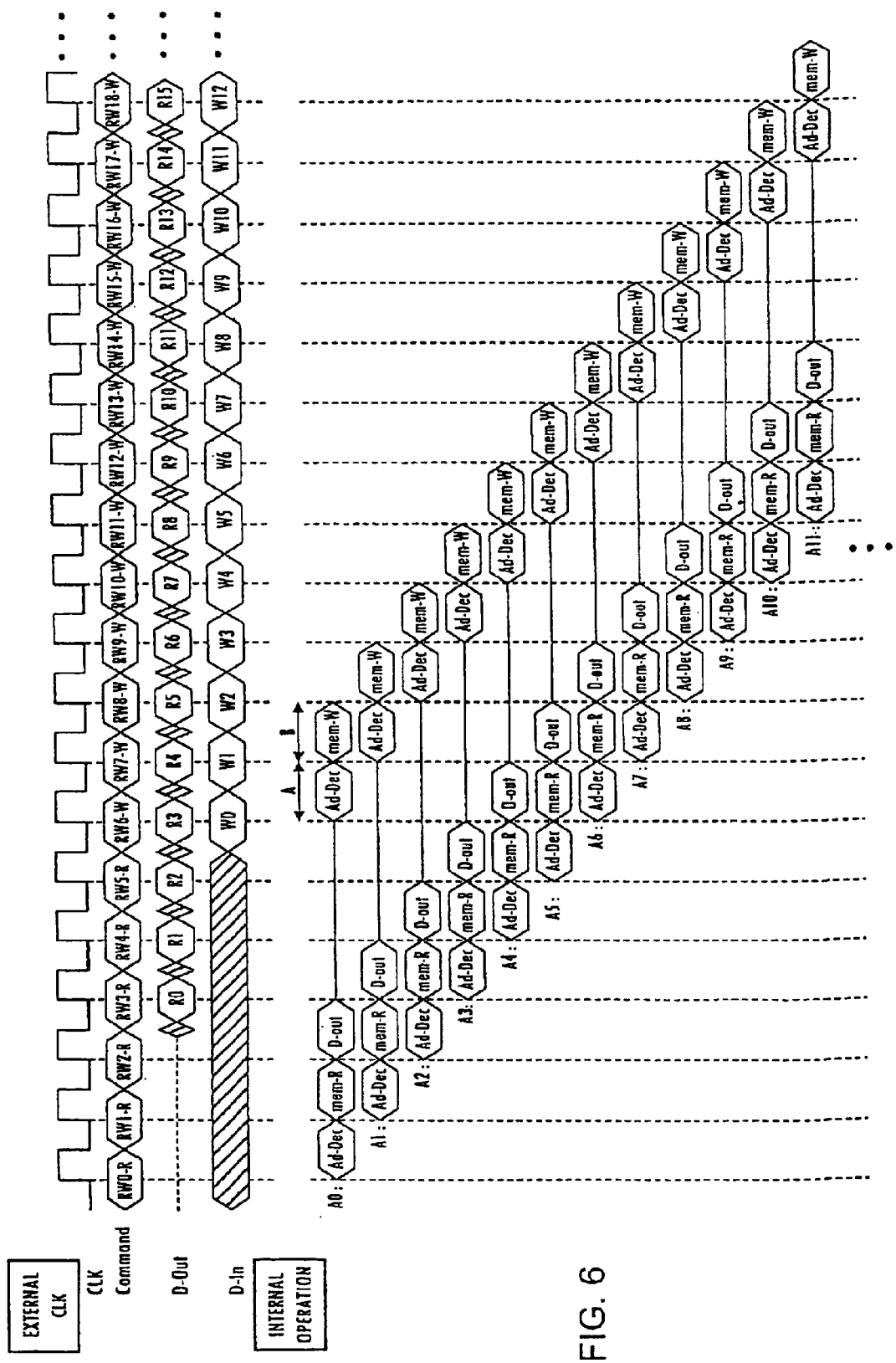
FIG. 6 is a timing chart of the semiconductor memory device of FIG. 5 at the time of an RMW operation.

Next, an explanation will be made of the RMW operation of the semiconductor memory device constituted in this way by referring to the timing chart of FIG. 6.

In the upper part of FIG. 6, commands in synchronization with the clock signal CLK and the input/output data are described (hereinafter referred to as an external clock operation for convenience), while an internal operation to be executed in synchronization with the clock signal CLK from an external unit is indicated in the lower part. The command contains control information indicating whether it is an RMW operation or a usual data reading or writing operation of other than the address signal ADD.

In the chart of the internal operation, the symbols A0, A1, . . . indicate address numbers in the memory array 2. The address signal ADD in the command is decoded (Ad-Dec) for every clock signal CLK with respect to each memory cell given this address number and output (D-out) after the stored data is read out (mem-R). After this data output, in the next several clock cycles (here, three clock cycles), the z-address is subjected to the comparison processing as a link of the hidden-surface processing of the 3DCG, and the data after processing is fetched into the memory array 2 in the next one clock cycles and write-modified (mem-W) on the same address at which it was stored at first. Then, this RMW operation is continuously repeated with respect to each address without interruption while shifting the address by one pulse each by the clock signal CLK.

Further, also in the external clock operation, commands RW0-R, RW1-R, . . . , RW6-W, RW7-W, . . . , output data R0, R1, . . . , and input data W0, W1, . . . are continuously input or output without interruption.

The reason why such a continuous processing without interruption is possible will be explained below in order.

Based on the first six commands RW0-R to RW5-R, addresses A0 to A5 in the memory array 2 are sequentially designated (Ad-Dec) by the read only address decoder 4, and the data is read out (mem-R) and output (D-out). Accordingly, to the data output D-Out, the output data R0, R1, are output with a time lag from the command input by three clock sections.

After the next command RW6-W, the address at the time of a data write operation is simultaneously designated in addition to the address at the time of a data read operation. Namely, the address A0 is designated as the destination of the write modification by the write only address decoder 6 in the clock section A immediately after this by the first command RW6-W, and the address A6 at the next data read operation is simultaneously designated by the read only address decoder 4.

Based on these address designations, in the next clock cycle B, the write data W0 obtained by previously performing the comparison processing for the read data R0 in an external unit of the memory is write-modified to the original address A0, while new read data R6 is read from the address A6 in the memory array 2.

On the other hand, in this same clock cycle B, similar to the clock period A described above, the address A1 at the next data write operation and the address A7 at the next data read operation are simultaneously designated. Note that, the simultaneous designation of the data read address and the data write address becomes possible by shifting the column address (column line) between the data read and data write operations by exactly an amount of the above delay in for example the same row (word line).

In the clock sections after this, similar to the clock section B, two address designations and data read and write operations of data are executed for a short time such as one clock section.

Figure 2:
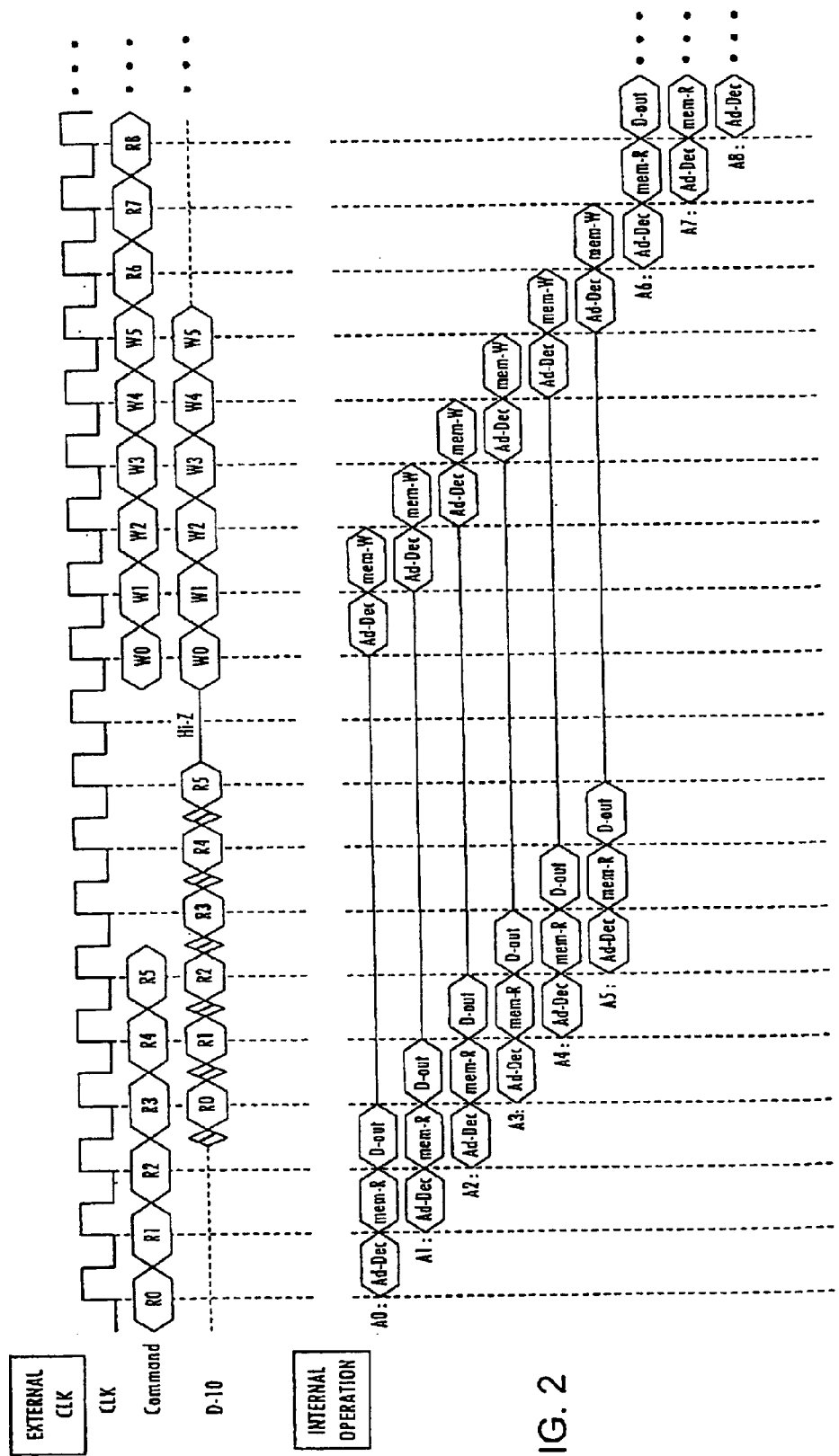
FIG. 2 is a timing chart in the semiconductor memory device of FIG. 1 at the time of an RMW operation.
Figure 3:
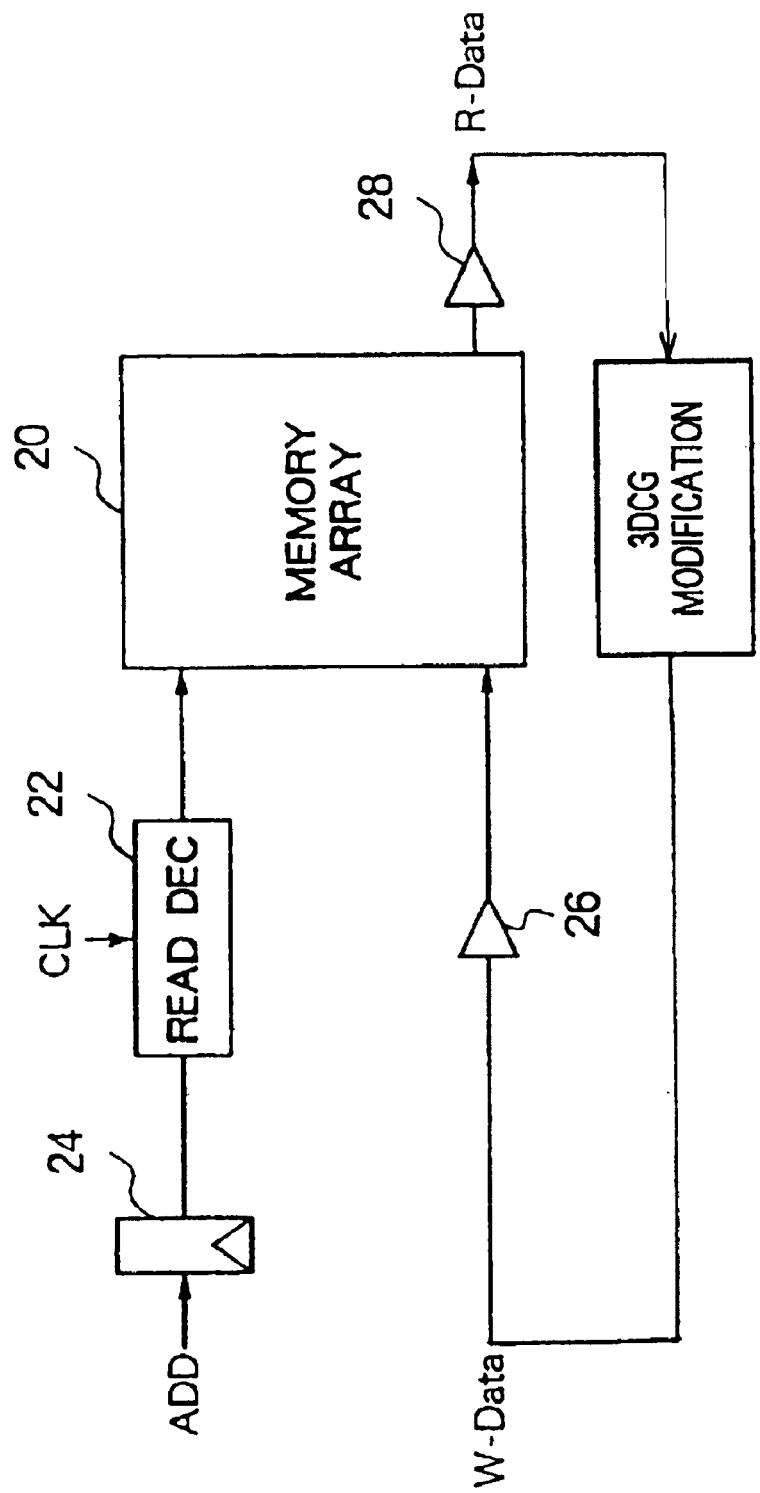
FIG. 3 is a block diagram of a semiconductor memory device showing another example of the related art configuration;.
Figure 4:
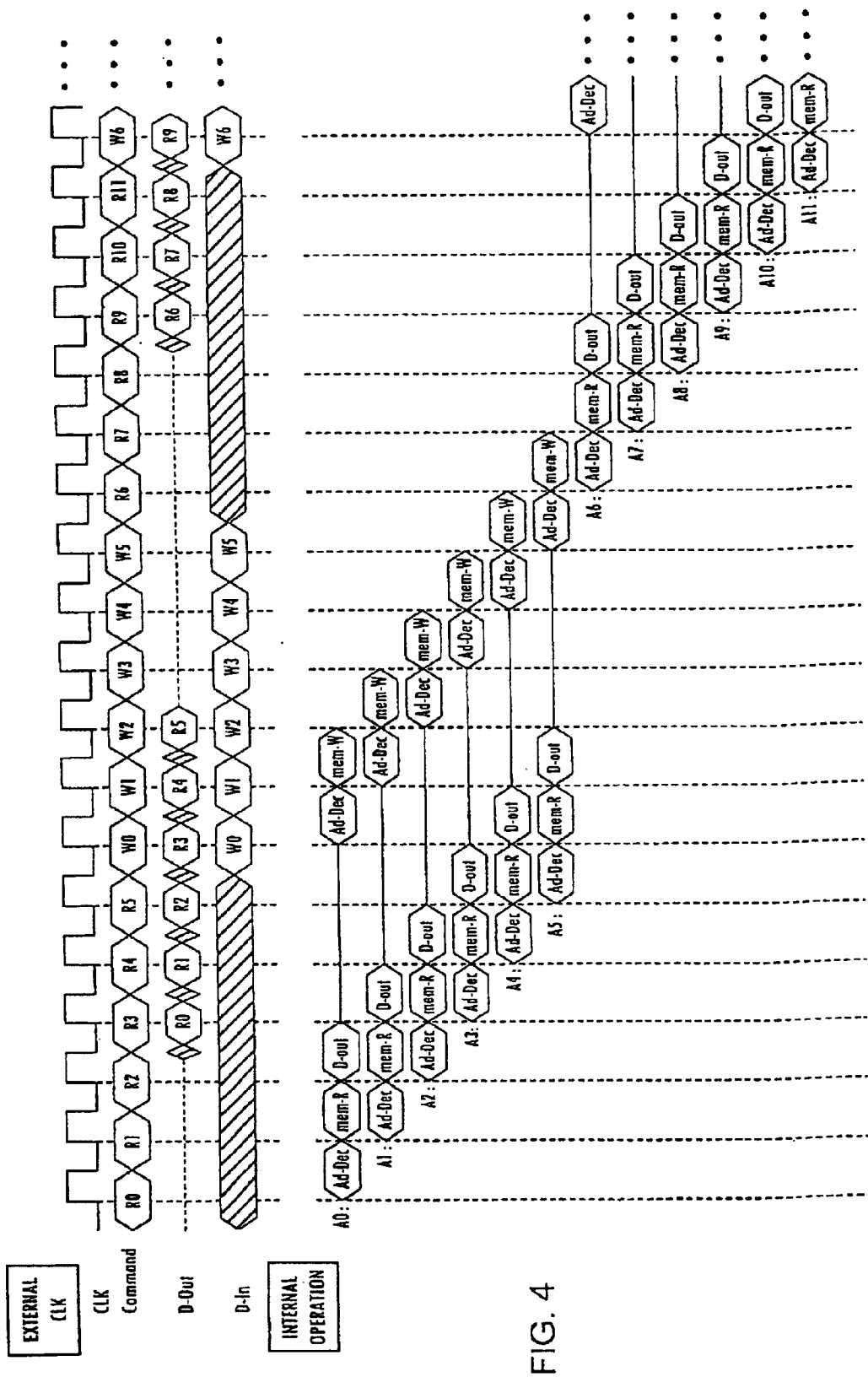
FIG. 4 is a timing chart in the semiconductor memory device of FIG. 3 of an RMW operation.

For this reason, when viewing this by the external clock operation shown in the upper part of FIG. 2, the command input, data output D-Out and the data input D-In are repeated without interruption.

Note that, at a usual data read or write operation, by the designation of the command (also other control signal is possible) in the above example, the operation of the FIFO memory 14 is stopped and one of the two decoders 4 and 6 is activated. For this reason, the address signal ADD entered from the common input is decoded by the ADD-activated decoder, the address designation of the memory array 2 is carried out, and then the data write or read operation is executed with respect to this.

In this way, the semiconductor memory device of the present invention is provided with the FIFO memory 14 (delaying means) in which the input and output are separated for eliminating the command waiting section in addition, the inputs of the address decoders 4 and 6 for the data read and write operation are made common for reducing the number of pins. Also the address designation to the memory array 2 by the two address decoders 4 and 6 is delayed at the time of a write operation more than that at a data read operation.

By this, the address designations at the time of the data read and write operations or the data read operation and data write operation in the memory array 2 conventionally requiring two clock cycles can be carried out in the same clock cycle.

Accordingly, the speed of the RMW operation is raised to two times the conventional operation, and a semiconductor memory device optimum as the z- buffer of for example 3DCG is realized.

Particularly, as this delaying means, in the present embodiment, the FIFO memory 14 is used as a digital delay line. The number of unit memory stages thereof can be freely changed, and the improvement of the performances is pursued to the limit for the RMW operation, while the flexibility in dealing with changes in methods etc. can be raised.

Second Embodiment

The present embodiment shows a case where a shift register of a multiple stage configuration is used in place of the FIFO memory 14 of the first embodiment described above as another example of the configuration of the delay unit in the present invention.

Figure 7:
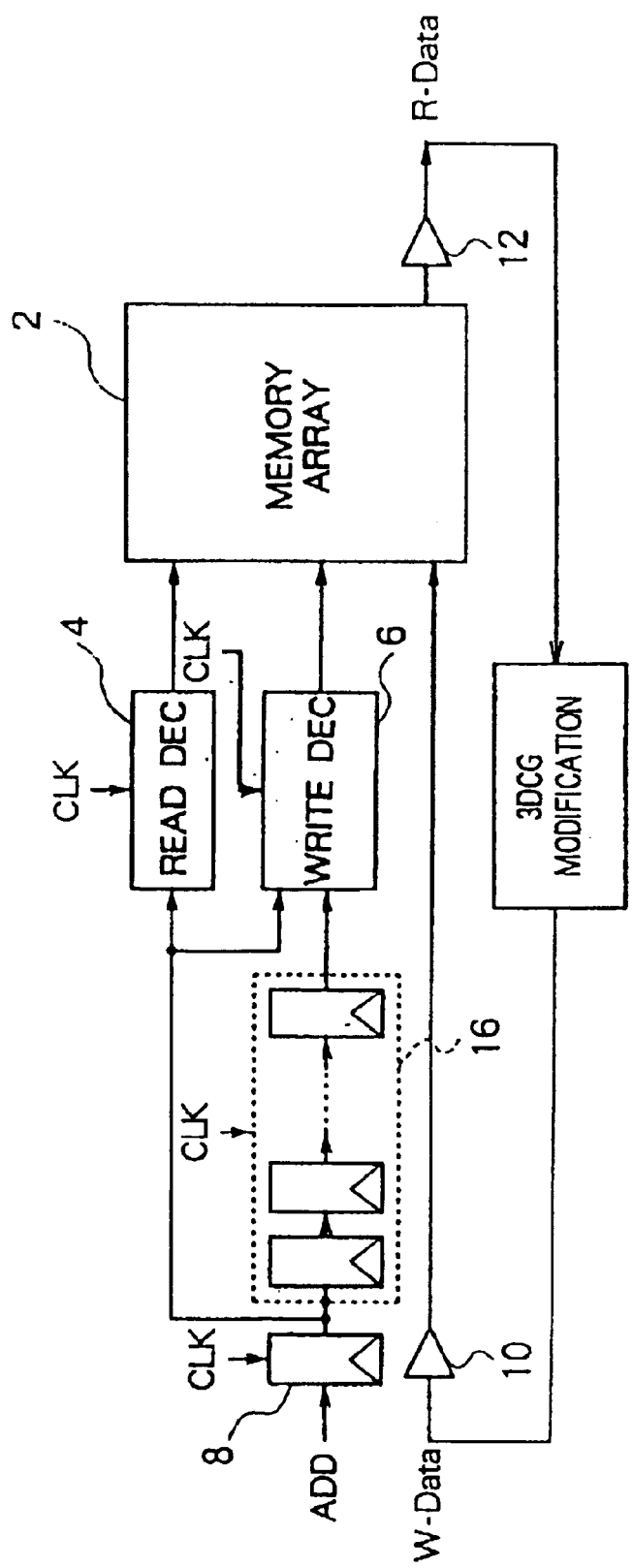
FIG. 7 is a schematic block diagram of the configuration of a semiconductor memory device according to a second embodiment of the present invention.

FIG. 7 is a schematic block diagram of a semiconductor memory device as an example of the semiconductor memory device according to the present embodiment. Here, the same parts as those of the first embodiment described above are given the same symbols or numerals, and the explanation thereof will be omitted. Further, also the timing chart does not change from that of FIG. 6, so an explanation of the entire operation will be omitted.

The shift register 16 serving as the delay unit shown in FIG. 7 has a configuration of a predetermined number of unit register stages of predetermined numbers of bits to which at least address signals ADD can be input together connected in lateral arrangement. Usually, the number of these unit register stages is determined in advance in accordance with the method of the RMW operation in which the semiconductor memory device is used.

Accordingly, the change of the delay time is not easy unlike the FIFO memory 14 of the first embodiment, but the change of the delay time is possible by using a clock other than that of the decoders 4 and 6 for shifting the data and changing the frequency. In this case, it is necessary to make the output of the final stage of the shift register 16 in synchronization with the clock signal CLK of the decoders 4 and 6 side.

Third Embodiment

The present embodiment shows a case where the time delay information with respect to the same address is imparted to the address signal per se without providing the delaying means, but the number of the address inputs is set to two instead of this.

Figure 8:
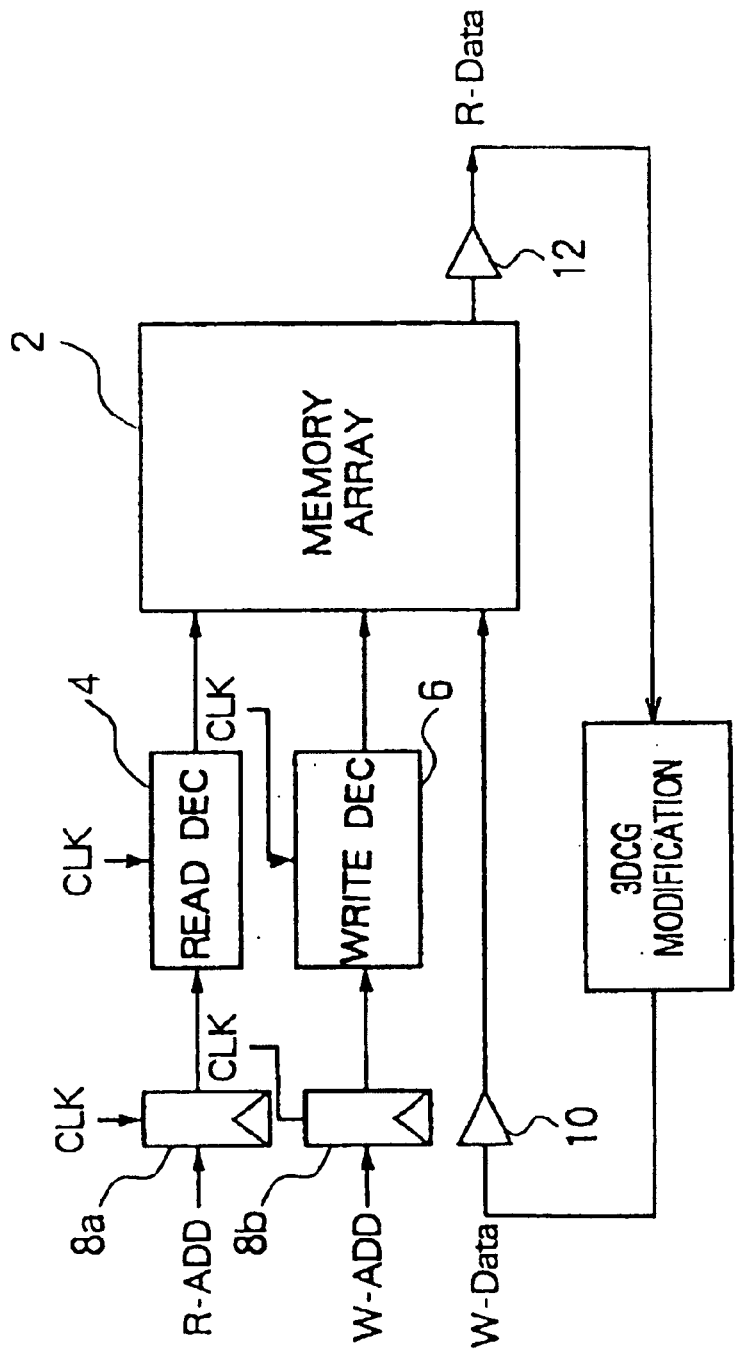
FIG. 8 is a schematic block diagram of the configuration of a semiconductor memory device according to a third embodiment of the present invention.

FIG. 8 is a schematic block diagram of a semiconductor memory device according to the present embodiment. Also here, the same symbols or numerals are attached to the same parts as those of the above first embodiment, and an explanation thereof will be omitted. Further, also the timing chart does not change from that of FIG. 6, so the explanation of the entire operation will be omitted.

In the previously explained in the first and second embodiments, the address input terminals were commonly used at the time of data read and write operation for the reduction of the number of pins.

Contrary to this, the present embodiment adopts a structure of dividing the input of the address signal to that at the data reading and that at the data writing. This is preferred where there is a room in an increase of pin number, the delaying means is omitted by dividing the address input to that at the data reading and that at the data writing, and the structure is simplified.

Namely, as shown in FIG. 8, it is connected so that the read address signal R-ADD can be input to the read only address decoder 4 via the register 8a, and the write address signal W-ADD can be input to the write only address decoder 6 via the other register 8b.

In this case, the write address signal W-ADD is delayed in advance by only an amount of a few clock cycles (six clock cycles in the operation of FIG. 6) with respect to the read address signal R-ADD.

Accordingly, similar to the case of the first embodiment, when viewing a certain clock cycle, the address designation can be carried out in an overlapped manner for the new address as well as the address when performing the write modification of the data which was read a few clock cycles before and after the comparison processing, the read and write operation of the data can be executed with respect to the address designated in the cycle immediately before this in the same cycle. Thus it is possible to raise the speed of the RMW operation up to the limit.

As explained above, in the semiconductor memory device according to the present invention, the input and output are separated for eliminating the command waiting section etc., address decoders for the data read and write operations are separately provided, and a means (delay unit) for delaying the address designation of the writing side from that on the reading side by exactly a predetermined time is provided, therefore it is possible to execute the RMW operation (two address designations, data read operations, data write operations, and data input/output) in one clock cycle. For this reason, the speed of the RMW operation is raised to two times the conventional operation, and the drawing performances etc. of 3DCG can be enhanced up to the limit.

Further, it is possible to use the same inputs of the address decoders for the data read and write operations, so the number of address input pins can be halved.

Further, if the memory of the previous input and previous output type memory is used as the delay unit, a change of the delay time is possible.

From the above, for a memory operating in clock synchronization, it becomes possible to perform the operations of data write and read operations in the same clock section, and it becomes possible to provide a semiconductor memory device capable of continuously performing a high speed RMW operation. As a result, for example the speed of the hidden-surface processing of 3DCG is conspicuously improved.

Accordingly, the efficiency of the RMW operation is raised to two times the related art operation, and a semiconductor memory device optimum as for example the buffer for 3DCG can be realized.

What is claimed is:

1. A semiconductor memory enabling a read modify write operation of data, comprising:
   a memory cell array including a plurality of memory cells arranged in a matrix and able to be written with and read:
   a read address decoding means for independently decoding an address of a read memory cell in response to a first designated address;
   a write address decoding means for independently decoding a write address of a memory cell in response to a second designated address;
   a data reading means for reading data of a memory cell addressed by said decoded read address in said read address decoding means;
   a data writing means for writing data to a memory cell addressed by said decoded write address in said write address decoding means; and
   an address delay means by which said decoded write address decoded by said write address decoding means is delayed by a predetermined time from a read address decoded by said read address decoding means, said predetermined time being set as a predetermined plurality of times of basic synchronization pulse periods so that the data read modify write operation is accomplished in a pipeline manner by said basic synchronized pulse.

2. A semiconductor memory as set forth in claim 1, wherein said address delay means includes an auxiliary temporary memory for storing said address, said auxiliary temporary memory being arranged at an input stage of said write address decoding means.

3. A semiconductor memory as set forth in claim 2, wherein said auxiliary temporary memory includes a predetermined plurality of sub-auxiliary temporary memories in series connection, each of said sub auxiliary temporary memories being able to input said input address signal simultaneously.

4. A semiconductor memory as set forth in claim 3, wherein said predetermined plurality of memories in series connection is able to change in response to a select signal by which at least one of an input stage sub auxiliary memory or an output stage sub auxiliary temporary memory is selected.

5. A semiconductor memory as set forth in claim 2, wherein said auxiliary temporary memory includes a predetermined plurality of registers in series connection, said registers being able to input said input address signal simultaneously, wherein said input address signal is output after said predetermined plurality of data shifts via said registers, each data shift being accomplished synchronized with said basic synchronized pulse.

6. A method of a semiconductor memory enabling a read modify write operation of data, said semiconductor memory comprising: a memory cell array including a plurality of memory cells arranged in a matrix and able to be written with and read out data; a read address decoding means for independently decoding an address of a read memory cell in response to a read address; a write address decoding means for independently decoding an address of a write memory cell in response to a write address; and an address delay means by which a write address decoded by said write address decoding means is delayed by a predetermined time from a read address decoded by said read address decoding means, in said method, said predetermined time is set as a predetermined plurality of times of basic synchronization pulse periods so that the data read modify write operation is accomplished in a pipeline manner by said basic synchronized pulse.

7. A method of a semiconductor memory as set forth in claim 6, wherein said address delay means includes an auxiliary temporary memory for storing said address, and wherein said auxiliary temporary memory is arranged at an input stage of said write address decoding means.

8. A method of a semiconductor memory as set forth in claim 7, wherein said auxiliary temporary memory includes a predetermined plurality of sub-auxiliary temporary memories in series connection, and wherein each of said sub auxiliary temporary memories is able to input said input address signal simultaneously.

9. A method of a semiconductor memory as set forth in claim 8, wherein said predetermined plurality of memories in series connection is able to change according to a select signal by which at least one of an input stage sub auxiliary memory or an output stage sub auxiliary temporary memory is selected.

10. A method of a semiconductor memory as set forth in claim 7, wherein said auxiliary temporary memory includes a predetermined plurality of registers in series connection wherein said registers is able to input said input address signal simultaneously, and
   wherein said input address signal is output after said predetermined plurality of data shifts via said registers, each data shift being accomplished synchronized with said basic synchronized pulse.

11. A method of read modify write operation of data, comprising the steps of:
   independently decoding a read address of a memory cell in response to a first designated address;
   independently decoding a write address of a memory cell in response to a second designated address;
   reading data of a memory cell addressed by said decoded read address;
   writing data to a memory cell addressed by said decoded write address; and
   delaying said decoded write address by a predetermined time from the time of said decoding of said read address, said predetermined time being defined as a predetermined plurality of times of basic synchronization pulse periods so that the data read modify write operation is accomplished in a pipeline manner by said basic synchronized pulse.

12. A circuit for enabling a read-modify-write operation of data, said circuit comprising:

a memory cell array including a plurality of memory cells;

an address delaying circuit for delaying transfer of an address for a predetermined delay time to generate a delayed address;

a read address decoding circuit for processing said address to generate a read address, said memory cell array outputting data stored at a memory cell address designated by said read address; and a write address decoding circuit for processing said delayed address to generate a write address, said memory cell array storing data at a memory cell address designated by said write address.

13. A circuit according to claim 12, wherein said address delaying circuit, said read address decoding circuit, and said write address decoding circuit are synchronized by a common clock.

14. A circuit according to claim 12, wherein said address delaying circuit comprises a first-in first-out memory circuit.

15. A circuit according to claim 12, wherein said address delaying circuit comprises a shift register circuit.

16. A circuit according to claim 15, wherein said address delaying circuit, said read address decoding circuit, said write address decoding circuit, and said shift register are synchronized by a common clock.

17. A method of performing a read-modify-write operation on a memory cell array, said memory cell array including a plurality of memory cells, said method comprising:

delaying transfer of an address for a predetermined delay time to generate a delayed address;

processing said address to generate a read address;

processing said delayed address to generate a write address;

outputting data from said memory cell array stored at a memory cell address designated by said read address; and storing data to said memory cell array at a memory cell address designated by said write address.

18. A method according to claim 17, wherein said step of delaying is performed by a first-in first-out memory circuit.

19. A method according to claim 17, wherein said step of delaying is performed by a shift register circuit.

20. A method according to claim 17, wherein said step of delaying is performed by an address delaying circuit;

said step of processing said address to generate said read address is performed by a read address decoding circuit; and said step of processing said address to generate said write address is performed by a write address decoding circuit.

21. A method according to claim 20, further comprising:

synchronizing said address delaying circuit, said read address decoding circuit, and said write address decoding circuit by a common clock.

22. A method according to claim 21, wherein said address delaying circuit is a first-in first-out memory circuit.

23. A method according to claim 21, wherein said address delaying circuit is a shift register circuit.

* * * * *